United States Patent [19]
DeDoncker

[11] Patent Number: 5,166,549
[45] Date of Patent: Nov. 24, 1992

[54] ZERO-VOLTAGE CROSSING DETECTOR FOR SOFT-SWITCHING DEVICES

[75] Inventor: Rik W. A. A. DeDoncker, Schenectady, N.Y.

[73] Assignee: General Electric Company, Schenectady, N.Y.

[21] Appl. No.: 741,694

[22] Filed: Aug. 7, 1991

[51] Int. Cl.$^5$ .................... H03K 5/153; H03K 17/13
[52] U.S. Cl. .................... 307/354; 307/362; 363/89; 363/97; 323/235
[58] Field of Search ............ 307/350, 354, 362, 647; 363/89, 95, 96, 97, 124; 323/235

[56]     References Cited
U.S. PATENT DOCUMENTS 3,590,275  6/1971  Fisher ........................... 307/354
5,072,143  12/1991  Gantioler et al. ............. 307/354

Primary Examiner—John Zazworsky
Attorney, Agent, or Firm—Jill M. Breedlove; Marvin Snyder

[57]     ABSTRACT

A zero-voltage crossing detector includes a transistor circuit in combination with comparator circuitry for determining when the voltage across a soft-switching device crosses zero. The transistor circuit includes a series combination of a detector transistor and a source, or emitter, load resistance coupled across the soft-switching device. The gate, or base, of the transistor is coupled via a resistive voltage divider to a dc supply. The source, or emitter, of the transistor is coupled to the comparator circuitry for comparing the voltage across the load resistance to a zero-voltage reference. During intervals when the voltage across the soft-switching device is greater than the input voltage to the detector transistor, the detector transistor is off, causing the output of the transistor circuit to equal the input voltage. Otherwise, the detector transistor is active and the output voltage equals the voltage across the soft-switching device, so that the comparator circuitry generates signals to indicate the zero-voltage crossings.

3 Claims, 2 Drawing Sheets

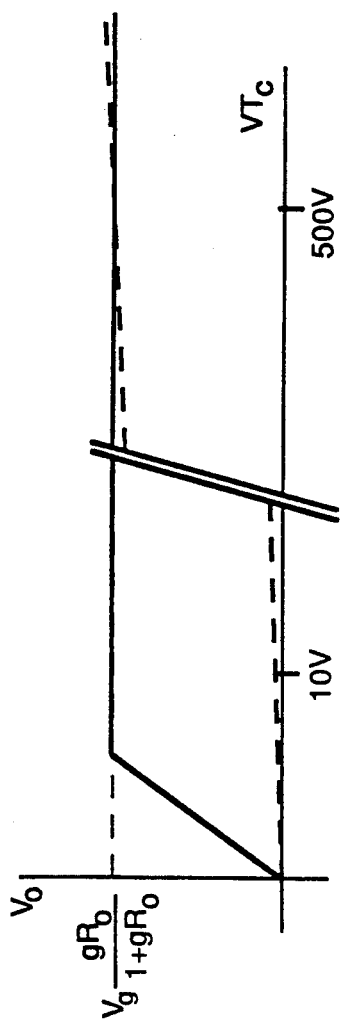
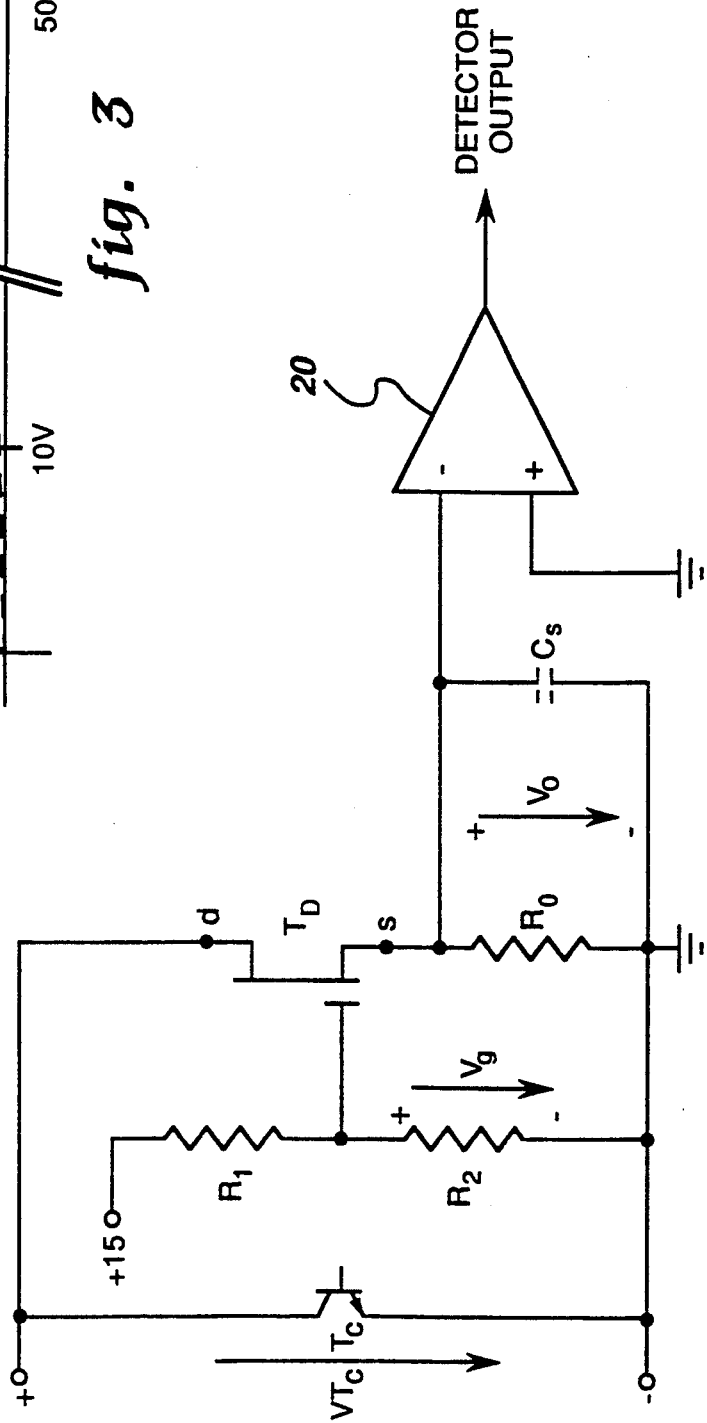

ZERO-VOLTAGE CROSSING DETECTOR FOR SOFT-SWITCHING DEVICES

FIELD OF THE INVENTION

The present invention relates generally to zero-voltage crossing detectors and, more particularly, to a simple and reliable zero-voltage crossing detector that is particularly suitable for detecting zero-voltage across a soft-switching device.

BACKGROUND OF THE INVENTION

To overcome the problem of active device switching losses in power converters, while enabling operation at higher switching frequencies, soft-switching converters have been developed. In general, there are two types of soft-switching, or resonant, converters: zero-voltage switching and zero-current switching. Zero-voltage switching involves switching the active devices when there is zero voltage thereacross. Zero-current switching involves switching the active devices when there is zero current therethrough. 1; in commonly assigned U.S. patent application no. 521,061 of R. W. De Doncker and V. Venkataramanan, filed May 3, 1990, now U.S. Pat. No. 5,038,267 which is incorporated by reference herein. The converter of De Doncker and Venkataramanan includes a rectifier for providing rectified ac voltage to a boost dc-to-dc converter, which in turn is coupled to an active clamped resonant dc link (ACRDCL). The ACRDCL employs a bidirectional current switch which can be realized with an active device and an anti-parallel diode. Resonant oscillations of the resonant dc link circuit are maintained via control of an active clamp switch. In order to suitably control and achieve soft-switching of the clamp switch, it is necessary to accurately detect the zero voltage crossings across the switch. This is typically accomplished by using a precision resistive voltage divider and comparator circuitry. Such a voltage divider reduces the maximum voltage that can be measured across the device to levels that are safe for the comparators. A reduction of 50 to 100 or more times is generally necessary. Disadvantageously, therefore, to limit losses in the resistive divider, the voltage detecting circuit has a high input impedance, which results in a high sensitivity to noise signals. Furthermore, the high input impedance of the voltage divider together with any stray capacitance between the input of the comparator and ground create a low pass filter that distorts the voltage signal. As a result, the comparator may turn on the clamp switch at non-zero voltage instants, i.e., in the range from 5 to 20 volts. This causes a hard-switching phenomena which further increases the noise in the system. Hence, it is very difficult to detect accurately the zero-voltage crossings of the clamp switch at higher resonant dc bus voltages and frequencies with a resistive voltage divider.

Accordingly, it is an object of the present invention to provide a new and improved zero-voltage crossing detector which enables accurate and reliable detection of the zero-voltage crossings across an active device to achieve soft-switching thereof.

SUMMARY OF THE INVENTION

A zero-voltage crossing detector according to the present invention comprises a transistor circuit in combination with comparator means for determining when the voltage across a soft-switching device crosses zero. The transistor circuit includes a series combination of a transistor and a source, or emitter, load resistance coupled across the soft-switching device. The gate, or base, of the transistor is coupled via a resistive voltage divider to a dc supply. The source, or emitter, of the transistor is coupled to comparator means for comparing the voltage across the load resistance to a zero-voltage reference. At the zero-voltage crossings across the transistor, the comparator means generates a logic level signal indicative thereof. In a preferred embodiment, the transistor comprises a high-frequency, high-voltage MOSFET.

In operation, at relatively high voltages across the soft-switching device, the MOSFET is almost completely turned off such that the voltage across the load resistance is substantially equal to the MOSFET gate voltage $V_g$. Once the voltage across the soft-switching device drops below the gate voltage $V_g$, the MOSFET turns on, and the MOSFET drain-source voltage drops to a very low value, indicating that the voltage across the load resistance is substantially equal to the voltage across the soft-switching device. Advantageously, therefore, the soft-switching device can be accurately turned on at the zero-voltage crossings. Moreover, the low impedance of the MOSFET under these conditions makes the detector circuit very insensitive to noise and stray capacitances, and the on-state voltage of the soft-switching power device can be accurately monitored. Hence, as an additional advantage, the saturation voltage of the soft-switching device is monitored to ensure that it does not become too large, thus indicating an overload current condition.

BRIEF DESCRIPTION OF THE DRAWINGS

The features and advantages of the present invention will become apparent from the following detailed description of the invention when read with the accompanying drawings in which:

FIG. 2 is a schematic illustration of a zero-voltage crossing detector according to a preferred embodiment of the present invention; and FIG. 3 graphically illustrates the voltage characteristic of the zero-voltage crossing detector according to the present invention and a typical voltage divider type detector characteristic.

DETAILED DESCRIPTION OF THE INVENTION

Figure 1:
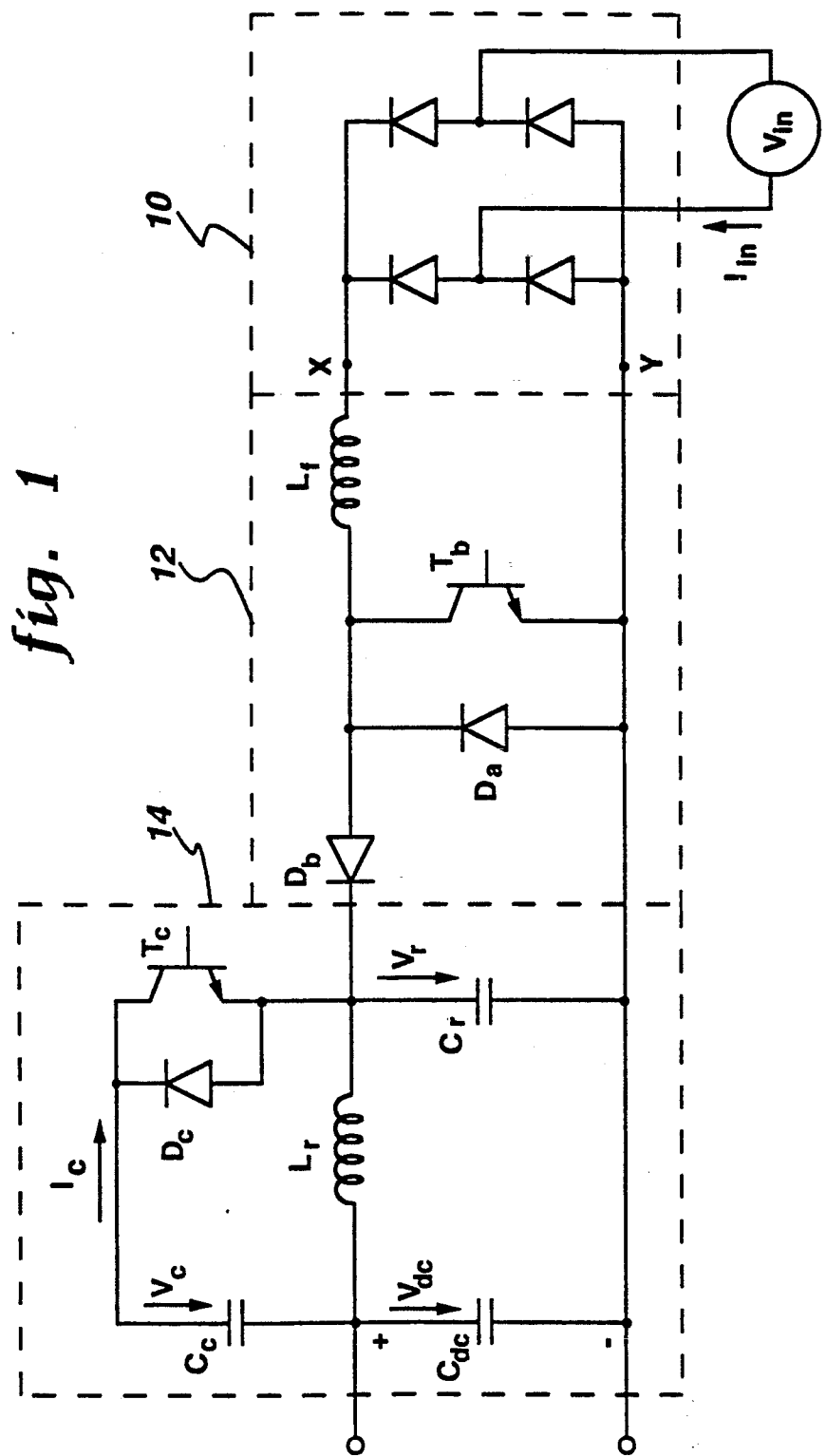
FIG. 1 is a schematic illustration of a soft-switching power converter, including a soft-switching clamp switch, for which the zero-voltage crossing detector may be advantageously employed to determine the zero-voltage crossings across the clamp switch.

FIG. 1 is a schematic illustration of a soft-switching power converter useful in describing the operation and advantages of the zero-voltage crossing detector of the present invention. In particular, the power converter of FIG. 1 is of a type employing an active clamped resonant dc link (ACRDCL), as described in U.S. Pat. No. 5,038,267 of R. W. De Doncker and V. Venkataramanan, cited hereinabove. It is to be understood, however, that the zero-voltage crossing detector of the present invention is not limited to ACRDCL converters, but may be employed in other types of circuits wherein zero-voltage crossing detection is desirable. For example, the zero-voltage crossing detector may be employed to determine the zero-voltage crossings of the soft-switching devices in an auxiliary resonant commutated pole (ARCP) converter, such as that described in commonly assigned U.S. patent application no. 583,910 of R. W. De Doncker and J. P. Lyons, filed Sep. 17, 1990, now U.S. Pat. No. 5,047,913 which is incorporated by reference herein.

As shown in FIG. 1, a full-wave diode rectifier 10 is coupled to an ac voltage source $V_{in}$ for rectifying the ac voltage applied thereto. Rectifier 10 is coupled to a boost dc-to-dc power converter 12 comprising a filter inductor $L_f$ connected in series with a boost diode $D_b$ and further comprising a boost switching device $T_b$ connected across the junction between boost diode $D_b$ and filter inductor $L_f$ and ground. An additional diode $D_a$ is connected in antiparallel with boost switching device $T_b$. The cathode of boost diode $D_b$ is coupled to an ACRDCL circuit 14. In particular, the resonant dc link (RDCL) comprises a relatively small resonant capacitor $C_r$ coupled to a resonant inductor $L_r$. An active clamping circuit is coupled to the resonant circuit ($L_r$ and $C_r$) for maintaining the voltage $V_r$ across the dc link between zero and a predetermined maximum level $kV_{dc}$. The clamping circuit comprises a clamp switching device $T_c$ connected in antiparallel with a clamp diode $D_c$, the antiparallel combination of device $T_c$ and diode $D_c$ being connected in series with a clamp capacitor $C_c$. The resonant dc link is directly connected via inductor $L_r$ to the dc bus $V_{dc}$ which is supported by a dc bus capacitor $C_{dc}$.

In operation of the soft-switching power converter of FIG. 1, resonance is maintained by suitable control of clamp switching device $T_c$, as described in U.S. Pat. No. 5,038,267 of R. W. De Doncker and G. Venkataramanan, cited hereinabove. For maximum efficiency, the clamp switching device $T_c$ has to be turned on at the moment the voltage thereacross falls to zero.

FIG. 2 illustrates a zero-voltage crossing detector according to a preferred embodiment of the present invention useful in determining the zero-voltage crossings across clamp switching device $T_c$ of FIG. 1. The zero-voltage crossing detector comprises a transistor circuit in combination with comparator means for determining when the voltage across the soft-switching device, e.g., the clamp switching device $T_c$ (FIG. 1), crosses zero. As shown in FIG. 2, the transistor circuit includes a series combination of a detector transistor $T_D$ and a source load resistance $R_o$ coupled across the soft-switching device. (Although detector transistor $T_D$ is shown in FIG. 2 as comprising a MOSFET, other suitable high-frequency transistors may be used, such as, for example, bipolar junction transistors or insulated gate bipolar junction transistors.) A pair of voltage-dividing resistors $R_1$ and $R_2$ is coupled across a dc supply, e.g., 15 volts, the junction between resistors $R_1$ and $R_2$ being coupled to the gate of MOSFET $T_D$ to control the MOSFET gate voltage, if desired. Otherwise, the gate of MOSFET $T_D$ may be coupled directly to the dc supply. The source of MOSFET $T_D$ is coupled to the input of comparator means 20 for comparing the voltage across load resistance $R_o$ to a zero voltage reference.

In operation, at relatively high voltages $V_{Tc}$ across clamp switch $T_c$, MOSFET $T_D$ is almost completely turned off such that the voltage $V_o$ across load resistance $R_o$ substantially equals the MOSFET gate voltage $V_g$. Under these conditions, the MOSFET is near cut-off, and the voltage $V_o$ applied to comparator means 20 is represented by the expression:

$$V_o = V_g \frac{gR_o}{1 + gR_o}.$$

where g is the gain of the transistor near cut-off as represented by the expression:

$$g = \frac{i_d}{v_{gs}},$$

where $i_d$ represents the drain current, and $v_{gs}$ represents the gate-source voltage.

The product $gR_o$ is chosen such that $gR_o$ is much greater than one. The current $I_o$ through resistance $R_o$ is thus calculated as follows:

$$I_o = \frac{V_o}{R_o} = V_g \frac{g}{1 + gR_o} \approx \frac{V_g}{R_o}.$$

The MOSFET also conducts the current $I_o$. Because MOSFET $T_D$ blocks high voltage, load resistance $R_o$ should be chosen such that the power dissipation $P_d$ in the MOSFET remains below the maximum rated power $P_d^{max}$ according to:

$$P_d = (V_{Tc}^{max} - V_o) I_o = (V_{Tc}^{max} - V_o) \frac{V_o}{R_o} \leq P_d^{max},$$

where $V_{Tc}^{max}$ is the maximum voltage across the soft-switching clamp device $T_c$. At high voltages $V_{Tc}$, power $P_d$ can be approximated as:

$$P_d \approx V_{Tc}^{max} \cdot \frac{V_g}{R_o}.$$

Hence, the load resistance $R_o$ should be selected to be large enough to limit the power loss in the MOSFET. Compared to the resistive-voltage-divider detector described hereinabove, however, the load resistance $R_o$ can be at least an order of magnitude smaller than the load resistance of a resistive-voltage-divider detector because the gate voltage $V_g$ is much lower than the voltage $V_{Tc}^{max}$, which makes the circuit less sensitive to noise.

Once the voltage $V_{Tc}$ across clamp switch $T_c$ drops below the gate voltage $V_g$, as determined by the resistive divider $R_1$ and $R_2$, the MOSFET turns on (near saturation), and the drain-source channel resistance drops to very low values, e.g. 0.5–10 ohms. Hence, the voltage across load resistance $R_o$ is substantially equal to the voltage across the clamp switch $T_c$, so that zero-voltage crossing detection is possible. In particular, at each zero-voltage crossing, comparator means 20 generates a logic level signal indicative thereof. Comparator means 20 may be implemented, for example, using two LF311 comparators, manufactured by National Semiconductor Corporation, and associated circuitry according to methods known in the art for designing reliable comparator circuitry for comparison of an input voltage to a zero-voltage reference.

Advantageously, the on-state resistance of the MOSFET is minimal (e.g., in the range from 0.5–10 ohms), making the zero-voltage detector circuit of FIG. 2 very insensitive to noise and any stray capacitance $C_s$ across the load resistance $R_o$. Hence, the on-state voltage of the soft-switching power device can be accurately monitored, which is useful for protecting the device when the saturation voltage becomes too large, indicating an overload current condition.

As still another advantage, the zero-voltage crossing detector of the present invention is capable of reaching high resonant link frequencies, e.g. 100 kHz, at high voltage levels.

FIG. 3 graphically illustrates the output voltage characteristic (solid line) of an exemplary zero-voltage crossing detector of the present invention and that of a voltage divider (dashed line) such as those typically used for zero-voltage detection. For the zero-voltage crossing detector of the present invention, the output voltage $V_o$ applied to comparator means 20 is constant over a very wide range of voltages $V_{Tc}$ across clamp switching device $T_c$, thus enabling accurate detection thereof. On the other hand, for a typical voltage-divider type zero-voltage crossing detector, the voltage $V_o$ applied to the comparator has to be substantially reduced, with the result that the detector often generates a signal to turn on the clamp switching device too early or too late, e.g., at 5 to 20 volts rather than zero volts as desired.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A zero-voltage crossing detector for detecting the zero-voltage crossings across a soft-switching device, comprising:

a transistor circuit for coupling across the soft-switching device, said transistor circuit comprising a detector transistor having a source or emitter, said transistor circuit further comprising a load resistance coupled to the source or emitter of said detector transistor, said detector transistor having an input for coupling to a dc supply, a voltage across said load resistance being substantially equal to a voltage across the soft-switching device when said detector transistor is conductive, and the voltage across said load resistance being substantially equal to the voltage at the input of said detector transistor when said detector transistor is substantially off; and comparator means coupled to said load resistance for generating a logic level signal for indicating each zero-voltage crossing across the soft-switching device.

2. The zero-voltage crossing detector of claim 1, further comprising a pair of series-coupled input resistors coupled across said dc supply, the junction between said input resistors being coupled to the input of said detector transistor.

3. The zero-voltage crossing detector of claim 1 wherein said detector transistor comprises a MOSFET.

* * * * *